(12) United States Patent
Harvey

(10) Patent No.: US 6,665,210 B1
(45) Date of Patent: Dec. 16, 2003

(54) DATA STORAGE AND RETRIEVAL

(75) Inventor: Ian Nigel Harvey, Cambridge (GB)

(73) Assignee: nCipher Corporation Limited, Cambridge (GB)

(*) Notice: Subject to any disclaimer, the term of this patent is extended or adjusted under 35 U.S.C. 154(b) by 0 days.

(21) Appl. No.: 10/030,883

(22) PCT Filed: Apr. 27, 2000

(86) PCT No.: PCT/GB00/01647
§ 371 (c)(1),
(2), (4) Date: Oct. 24, 2001

(87) PCT Pub. No.: WO00/65478
PCT Pub. Date: Nov. 2, 2000

(30) Foreign Application Priority Data

Apr. 27, 1999 (GB) ............................................. 9909539

(51) Int. Cl.[7] ............................................... G11C 16/04
(52) U.S. Cl. ..................... 365/185.03; 365/49; 365/236; 365/239; 711/108
(58) Field of Search ............................... 365/185.03, 49, 365/230.02, 230.09, 236, 239; 711/3, 108, 216

(56) References Cited

U.S. PATENT DOCUMENTS 5,530,958 A * 6/1996 Agarwal et al. ............... 711/3
5,623,545 A * 4/1997 Childs et al. .................. 380/2
6,044,077 A * 3/2000 Luijten et al. ............... 370/392

* cited by examiner

*Primary Examiner*—Richard Elms
*Assistant Examiner*—Toan Le
(74) *Attorney, Agent, or Firm*—Young Law Firm, P.C.

(57) ABSTRACT

The invention relates to a method of storing items of data in a memory device. The memory device has an array of a storage locations, each identified by an address corresponding to a unique multi-bit index value. The data items consist of a multi-bit identifier value and an information value. The method includes generating a first index value corresponding to the address of a fist storage location as a first function of the identifier value of an item of data and a first number from a predetermined sequence of numbers. If the first storage location is unoccupied, the item of data is stored therein. Alternatively, if the first storage location is already occupied, a second index value corresponding to the address of a further storage location is generated as a function of the identifier value and a second number from the predetermined sequence of numbers. If the further storage location is unoccupied, the item of data is stored therein. The invention also relates to a memory device for storing items of data.

21 Claims, 3 Drawing Sheets

DATA STORAGE AND RETRIEVAL

BACKGROUND OF THE INVENTION

1. Field of the Invention

The invention relates to data storage and retrieval and in particular to the storage and retrieval of items of data consisting of associated value pairs.

2. Description of the Related Art

A typical computer network may consist of several end-user computer terminals which are interconnected via one or more central computer systems. Data is known to be transferred around such a network in the form of blocks, commonly called packets. Communication between various parts of the network may be achieved using a value known as a circuit ID. Each circuit ID is specific to the connection between two particular parts of the network. A packet which is to be sent between those particular parts has the corresponding circuit ID encapsulated within it. The circuit ID has an associated value termed the information value, and the circuit ID and information are stored together as an item of data id a memory of the network. To send data between the two particular parts, the network hardware has to extract the circuit ID from the packet and retrieve from the network memory the associated information value. The packet is then routed, encrypted or otherwise operated on as dictated by the information value.

Asynchronous transfer mode (ATM) protocols utilised in computer network communications operate along the lines described above. Data is transferred around an ATM network in short packets called cells, each of which includes a circuit ID in 24-bit binary form. Thus, $2^{24}$ (over 26 million) different IDs are feasible. As a consequence, processors within an ATM network must be able to retrieve one of a potentially large number of information values for routing etc. the cell whilst still keeping pace with the arrival of new cells for processing.

It is possible to store data in a random access memory (RAM) device with as many storage locations as the maximum feasible number of data items. For instance, in the case of an ATM network, this would mean a $2^{24}$ storage location RAM. However, by current standards, this constitutes a very large RAM and may be difficult to fit on to a single integrated circuit, which is preferable. In addition, an ATM network will typically have only a small proportion of the total number of possible circuit IDs active at any one time, which means utilisation may be poor. Furthermore, an increase in the bit form of the circuit ID, for example in the case of the ATM network ID to 28- or 32-bit form, would necessitate an even larger RAM.

Rather than using a large RAM for storing data, typical networks, like an ATM network, tend to use so-called content addressable memories (CAMs). CAMs are capable of storing items of data consisting of pairs of values, such as an identifier value and an information value. Data can be retrieved from a CAM by presenting an identifier value and the associated information value is returned. A key feature of the CAM is that the total number of possible identifier values may greatly exceed the available storage locations, and not all possible identifier values can be stored simultaneously in the device.

A CAM device for an ATM network can be constructed by having a number of storage locations, each storing an identifier value and information value pair, and a comparator for comparing the stored identifier value and the input identifier value. Several thousand such cells are required for an ATM network, which means that a CAM can only realistically be implemented in custom integrated circuits. In addition, to insert a new value into a CAM requires searching for a location which does not contain a valid data pair. This can be time consuming.

A modification on the basic form of CAM is the hash table CAM. This is a device having a number of storage locations (indexed by a number i) each of which contains a pair of values, such as an identifier value and an associated information value, or may be empty. Each pair of values is stored using a hash function which generates an index value i from the identifier value, and the pair of values are stored in the location with the index *value i. The hash function reduces the range of identifier values to a smaller range of index values. This reduces the memory size requirements, and makes it practically feasible to build the CAM on a single integrated circuit.

The problem with a hash table CAM is that because the hash function reduces the large set of input values to a smaller set of index values, necessarily there will be two or more input values which map on to the same index value. This is called a collision and means that these two input values cannot be stored in the table at the same time.

Collision avoidance mechanisms have been implemented in software. The input value is initially processed by the hash table to produce an index value i. If the location corresponding to that i index value is already full, an adjacent range of i values, i.e. i+k, i+2k etc., is tried each in turn sequentially until an empty location is found. Such collision avoidance mechanisms have also been implemented in hardware. Although this is the simplest form of collision avoidance mechanism, it is highly inefficient when k is fixed. Alternatively, k may be derived from the input value via a so-called "hash function". This is more efficient, but usually involves arithmetic operations such as multiplication and division which are costly to build into hardware.

The present invention seeks to provide an improved memory device.

SUMMARY OF THE INVENTION

The invention provides a memory device for storing items of data, each item consisting of an identifier value and an information value, which device comprises an array of storage locations each identified by a unique index value, counting means for providing numbers from a number sequence and processing means for generating an index value for each item of data as a function of the identifier value of the item of data and a number from the number sequence wherein the item of data is stored in the location corresponding to the generated index value or, if that location is already occupied, in an alternative location corresponding to the index value generated as a function of the identifier value of the item of data and a subsequent number from the number sequence.

The device according to the invention enables the use of random functions for the generation of the index value. This leads to more efficient utilisation of the device. With known simple counting based generation methods, the likelihood of not finding an unoccupied location within the permitted number of attempts to locate data is high because if a location is already occupied, the probability is that the alternative location is also occupied. However, generation of the index value using a random function means that the alternative location is unlikely to be occupied. Thus, more data may be located before any item of data cannot be located within the maximum number of permitted attempts.

BRIEF DESCRIPTION OF THE DRAWINGS

The invention will now be described with reference to the drawings in which.

DESCRIPTION OF THE PREFERRED EMBODIMENTS

Figure 1:
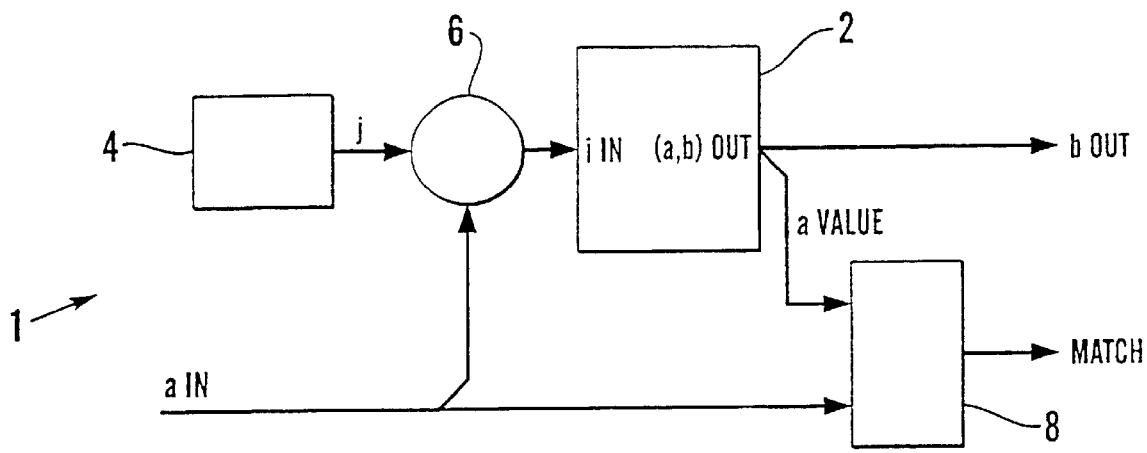
FIG. 1 is a schematic of the key elements of a device according to the present invention.

With reference to FIG. 1, the content addressable memory device according to the invention indicated generally at 1 comprises a memory 2 having an array of storage locations for data. The memory 2 has N storage locations each identified by a unique index value i such that i=1 to N. Each location is capable of storing associated pairs of data consisting of an identifier value a and an information value b. The device 1 further comprises counting means 4 including a step counter for providing numbers from a number sequence. The device 1 also comprises processing means 6 for generating an index value i for each item of data to be stored. The index value i is generated as a function of the identifier value a of the data to be stored and a number provided by the counting means 4. The first index value i is generated as a function of the identifier value a of the item of data and an initial number j provided by counting means 4. The item of data is stored in the location corresponding to the index value i generated. However, if that location is already occupied, an alternative index value i' is generated as a function of the identifier value a of the item of data and the next number j' in the number sequence. The item of data is stored in the alternative location corresponding to the alternative index value i' generated. Otherwise, the process continues until an empty location is found or for a predetermined number of attempts (steps) to locate the item of data.

The table below sets out figures for device utilisation in a device according to the invention, operated according to various different functions. The total device capacity, that is the total number of available memory locations, is the number N, where $N=2^w$ and the term (x) Mod N means extracting the w least significant bits of x. Thus if N=1024 ($=2^{10}$), the least significant 10 bits are extracted. S is the total number of possible attempts or steps allowable to locate an item of data before there is an unavoidable collision. The functions used are listed as I–IV below, I and II being equivalent to effectively configuring the invention in the form of the prior art.

I. f(a,j)=a mod N (simple hash function ignoring j)

II. f(a,j)=(a+j) mod N (prior art counting function: tries i, i+1, i+2 . . . )

III. f(a,j)=(a+j * (a/N)) mod N (tries a different counting sequence i, i+k, i+2k . . . where k is based on bits of a unused in the original i calculation).

IV f(a,j)=a>>>(k*j) modN, where >>> is a circular right shift and k is a constant usually having a value of 5.

| f (a, j) | N = 2048 | | N = 4096 | | N = 8192 | | |
|---|---|---|---|---|---|---|---|
| | S = 4 | S = 8 | S = 4 | S = 8 | S = 16 | S = 4 | S = 8 | S = 16 |
| I | 2.7% | 2.7% | 1.9% | 1.9% | 1.9% | 1.3% | 1.3% | 1.3% |
| II | 21% | 38% | 19% | 35% | 51% | 16% | 31% | 48% |
| III | 26% | 47% | 23% | 43% | 57% | 20% | 35% | 42% |
| IV | 27% | 50% | 24% | 46% | 68% | 20% | 43% | 65% |

Function III produces noticeably more efficient utilisation of the device 1 than functions I and II, but function IV is most effective.

Figure 2:
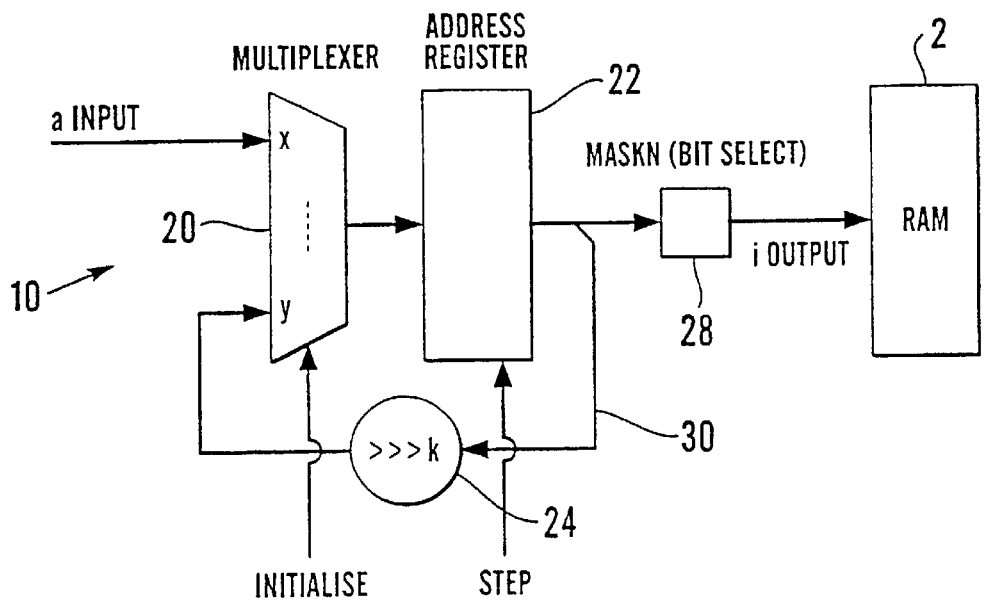
FIG. 2 is a schematic diagram of a preferred form of device according to the invention.

With reference to FIG. 2, a preferred form of device according to the invention is indicated generally at 10. The device is configured to operate using function IV as set out above, with the value of j, j' etc. taken from the number sequence 1, 2, 3, 4, 5 etc.

A multiplexer 20, address register 22 and rotate-by-five (>>>5) circuitry 24, which together effectively correspond to the processing means 6 illustrated in FIG. 1, are used in the process of locating addresses in a RAM 2. On a first address locating step, control logic (not shown) sets an Initialise signal to apply the input a value to the address register 22 and pulse a Step signal. The multiplexer 20 selects the x input of its two inputs x and y, and the address register 22 is clocked, so that the a value which is applied to the x input, is loaded into, and held in, the register 22. The input a value is then applied to bit select circuitry 28 which selects the least significant w bits of the address register output for use as the RAM address, where $2^w$=N, N being the total number of feasible locations in the RAM 2. The output of the bit select circuitry 28 is the first index value $i_0$.

The first index value i is applied to the RAM. Should the RAM logic detect a collision, the control logic sets the Initialise signal to cause the multiplexer 20 to select the y input which is connected to the output of the address register 22 via the rotate-by-five circuitry 24. The value applied to the y input of multiplexer 20 is thus the input a value rotated by five bit positions. The address register 22 is then clocked by means of the Step signal pulse which causes the value at the y input of multiplexer 20 to be loaded into the address register 22. The address register 22 copies the value at its input to the output where it is held fixed. The output of the address register 22 is applied to the RAM 2 via the bit select circuitry 28 to produce a second index value $i_{j'}$. If a further collision is detected by the logic circuitry in the RAM, the above steps are repeated such that the next value applied to the bit select circuitry 28 is the previous value rotated by a further five bit positions. The pattern of values held in the register 22 on consecutive steps is therefore a, a>>>k, a>>>2k, a>>>3k etc. which is equivalent to a, a>>>5, a>>>10, a>>>15 etc.

It will be appreciated that the feedback loop 30 defined by the output of the address register 22, the rotate-by-five circuitry 24 and they input of the multiplexer 20 could be removed and another rotation circuitry placed between the output of the address register 22 and the bit select circuitry 28. In this embodiment, the rotation circuitry would be required to be variable since the value applied to the address register would be constant in value. An advantage of the arrangement of FIG. 2 is that the feedback loop 36 allows the rotation circuitry 24 to be fixed at a constant rotation value (in this case 5) which is particularly convenient for implementation in hardware.

At each step, the bit select circuitry 28 selects the least significant w bits of the address register output for use as the RAM address, where $2^w=N$, N being the total number of feasible locations in the RAM 2. Thus the address used on subsequent clocks is a mod N, (a>>>5) mod N, etc.

Figure 3:
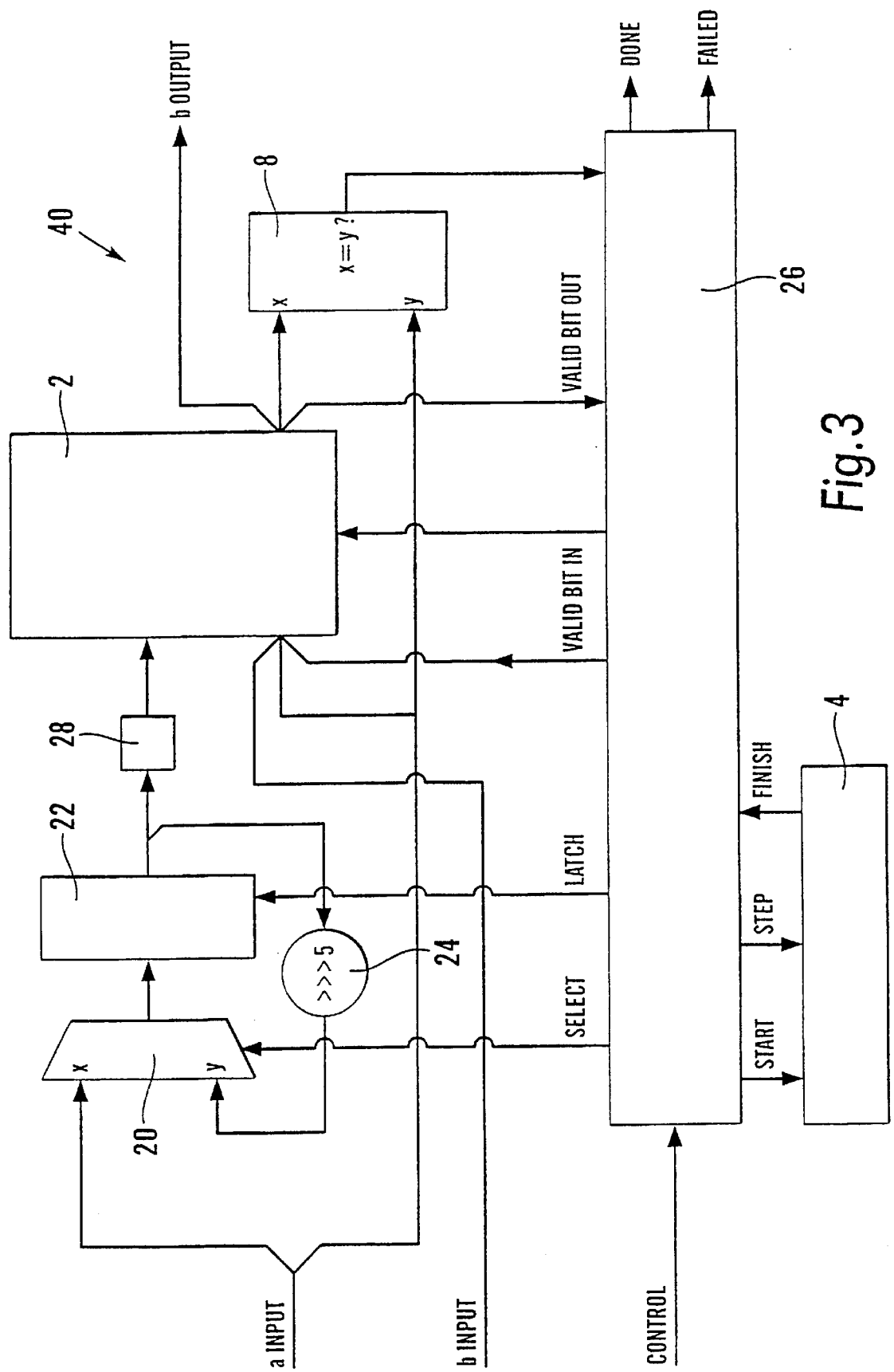
FIG. 3 is a hardware implementation of the device of FIG. 2.

Referring to FIG. 3, a hardware implementation for the above-described device is shown generally at 40. The layout illustrated is capable of storing and retrieving items of data consisting of an identifier value a and an information value b. The device 10 may perform three basic operations:

(i) A store operation in which an a, b pair is stored in a random access memory (RAM) 2;

(ii) A retrieve operation in which an a value is presented and the b value associated with it is retrieved from the RAM 2 and (iii) A delete operation in which a given a, b pair is deleted from the RAM 2.

The signal received on the control input line to control logic circuitry 26 determines which operation is to be performed. The done and failed output lines of the circuitry 26 are activated according to whether the operation has succeeded or failed.

At each allocated location in the RAM 2, the data stored consists of the a identifier value, the b information value and one additional bit, which is set if a, b is a valid pair and zero otherwise (i.e. the location is unused). The RAM 2 is read and written under the control of the control logic circuits 26.

Step counter 4 is used to fix the number of steps in the address location process used by the multiplexer 20 the register 22 and the >>>5 circuitry 24. The number j is chosen from a number sequence and the next number in the sequence is chosen with each step or, in this case, the value of j is effectively incremented by one with each step, and the chosen number in turn determines the multiple by which the >>>5 circuitry 24 acts upon the output from the address register 22. On the first step, the counter 4 is reset by pulsing the start line. On subsequent steps, the step line is pulsed and the next number j in the sequence is effective. When the design maximum number of steps has expired, the finish line goes active and the address location process is halted.

A comparator 8 compares the retrieved a value with the a input value. This is used when retrieving data to check whether a given RAM location contains the requested a, b value.

Control logic circuitry 26 contains logic to generate all the control signals used by all the other elements in the system.

For a store operation, the data to be stored is presented at the a input and b input. Firstly, the control logic 26 needs to find a location where this a, b pair can be stored. It does this by initialising the step counter 4 and the address register 22, then reading from the RAM at address a mod N, (a>>>5) mod N etc., until an empty RAM entry is found—in other words one where the valid bit is not set.

If no such location can be found before the step counter 4 finishes there are no suitable positions in the RAM 2 where the a, b pair can be stored. In this case the Failed output signal is activated and the control logic circuitry 26 stops the operation. If a suitable location is found, the control logic generates a write cycle to the RAM. The data written to the RAM consists of the a identifier value, the b information value, and a set valid bit. The control logic 26 circuitry then asserts the done output line, and this completes the operation.

In the retrieve operation, the a input lines contain an a value to be retrieved. The control logic circuitry will initialise the step counter 4 and the address register 22, and then read the RAM at addresses a mod N, (a>>>5) mod N etc until either:

the valid bit in that RAM location is set and the comparator 8 indicates that the a value stored in this location is equal to the a value being retrieved. In this case the b value in this location is output on the b lines, the control logic circuits 26 asserts the done output line and the operation is complete; or the step counter 4 finishes. In this case no location matching the a value could be found within the allowed number of steps. The control logic circuitry 26 asserts the failed output line and finishes.

For the delete operation, the a input lines contain the a value of the a, b pair to be deleted from the RAM 2. The control logic circuitry 26 will proceed as for the retrieve operation by starting the address register 22 and step counter 4 and searching through the RAM 2 until the required pair is found (as indicated by the valid bit being set and the comparator 8 indicating a match).

If the given pair is not found the control logic circuitry 26 will set the failed output and the operation finishes. Otherwise the control logic circuitry 26 will write to the RAM 4 location it found with the valid bit clear. The a and b values written here are not important; they will be ignored unless the valid bit is set.

The store operation as described above will give indeterminate operation if the same a value is stored in RAM 2 twice without an intervening delete operation to remove it. In some applications, this behaviour is guaranteed not to happen. For instance, before storing a particular a value, the system may perform a retrieve operation to see if it is already present; if so, a delete operation should be performed first. Otherwise, the store operation can be extended as follows: Look for the value in the RAM 2 and update if it is already present. This is almost identical to the delete operation, except that if found the valid bit is set instead of cleared. If the value is not found an ordinary store operation is then performed.

Figure 4:
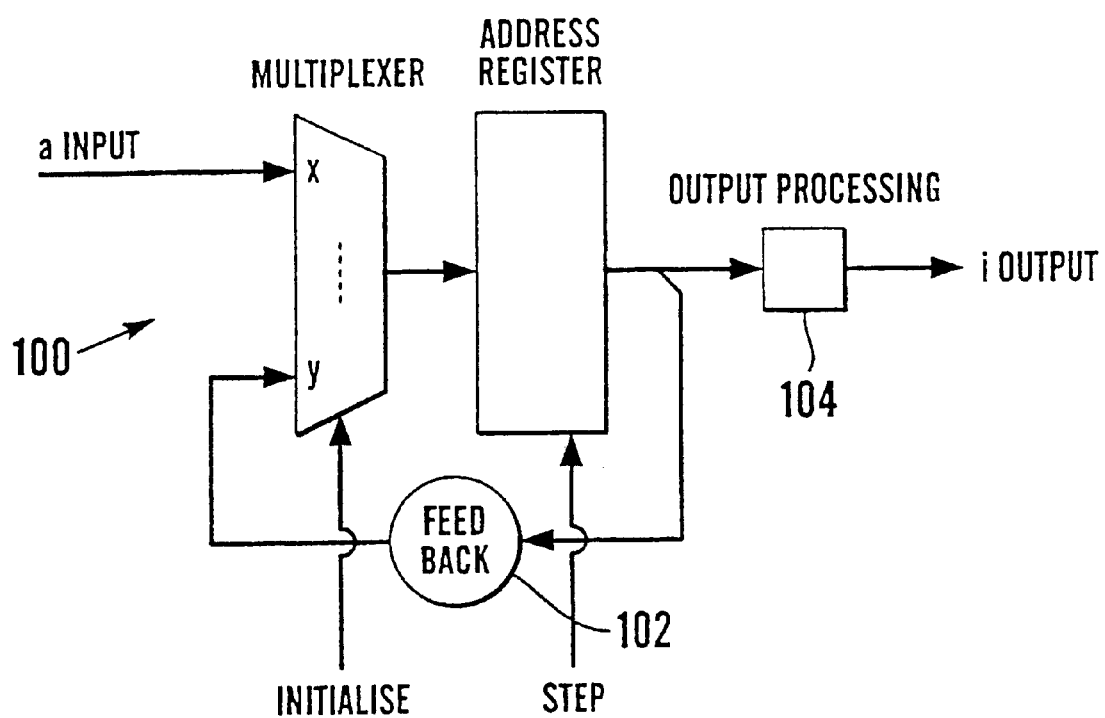
FIG. 4 is a schematic diagram of an alternative form of the device according to the invention.

Referring to FIG. 4, an alternative form of device according to the invention is shown generally at 100. In this embodiment, the >>>5 circuitry 24 and the bit select circuitry 28 are replaced by other functional blocks 102, 104, respectively. Although the >>>5 function and Mod N bit select function of FIG. 2 are the preferred functions, they could conceivably be replaced by one more of the following exemplary functions:

selecting any permutation of input bits (including masking and rotation);

combining input bits via logic or arithmetic operations (in particular exclusive-OR or addition which may be used to create a Linear Feedback Shift Register which has useful pseudo-random properties);

transforming a suitable number of bits through a look-up table or ROM; and/or using a function derived from a cryptographic algorithm.

What is claimed is:

1. A method of storing items of data in a memory device (10) having an array (2) of N storage locations, each identified by an address corresponding to a unique multi-bit index value, said items of data consisting of a multi-bit identifier value and an information value, the method comprising:

(a) generating a first index value corresponding to the address of a first storage location as a first function of the identifier value of an item of data and a first number from a predetermined sequence of numbers;

(b) accessing said first storage location in said array; and (i) if said first storage location is unoccupied, storing said item of data therein; or (ii) if said first storage location is already occupied, generating a second index value, corresponding to the address of a further storage location, as a second function of said identifier value and a second number from a predetermined sequence of numbers;

(c) accessing said further storage location in said array; and (d) if said firer storage location is unoccupied, storing said item of data therein.

2. A method according to claim 1 further comprising repeating steps (b) (ii) to (d) when said further storage location is occupied.

3. A method according to claim 1 wherein step (a) comprises extracting the w least significant bits of said identifier value where w=log$_2$N thereby to generate said first index value.

4. A method according to claim 1, wherein step (b) (ii) includes applying said second function to said first identifier value and then extracting the w least significant bits of said value where w=log$_2$N thereby to generate said second index value.

5. A method as claimed in claim 4 wherein said second function is defined by f(a,j)=(a>>>j*k); where a=said identifier value;

j=a predetermined number from said number sequence;

k=a predetermined constant; and

>>> denotes a rotation of the bits of said identifier value by j*k steps.

6. A method as claimed in claim 5 wherein k=5.

7. A method according to claim 2 wherein step (a) comprises extracting the w least significant bits of said identifier value where w=log$_2$N thereby to generate said first index value.

8. A method according to claim 2 wherein step (b)(ii) includes applying said second function to said first identifier value and then extracting the w least significant bits of said value where w=log$_2$N thereby to generate said second index value.

9. A method as claimed in claim 8 wherein said second function is defined by f(a,j)=(a>>>j*k); where a=said identifier value;

j=a predetermined number from said number sequence;

k=a predetermined constant; and

>>> denotes a rotation of the bits of said identifier value by j*k steps.

10. A method as claimed in claim 9 wherein k=5.

11. A memory device (10) for storing items of data, each item consisting of a multi-bit identifier value and an information value, the device comprising:

an array (2) of N storage locations each having an address identified by a unique index value;

counting means (4) for providing numbers from a predetermined sequence of numbers; and processing means for generating a first multi-bit index value for each item of data as a first function of the identifier value of the item of data and a number from the predetermined sequence of numbers;

wherein the item of data is stored in the location having an address corresponding to said first index value or, if that location is already occupied, in a further location having an address corresponding to a second multi-bit index value generated as a second function of the first identifier value and a subsequent number from the predetermined sequence of numbers.

12. A memory device as claimed in claim 11 wherein said second function is defined by f(a,j)=(a>>>j*k)

where: a=said identifier value;

j=said number from said number sequence;

k=a constant; and

>>>=a rotation of the binary digits of a by j*k steps.

13. A memory device as claimed in claim 12 wherein said processing means includes means (28) for extracting the w least significant bits of said identifier values where w=log$_2$N thereby to generate said index values.

14. A memory device according to claim 12 wherein said counting means (4) comprises a step counter and said numbers in said number sequence are incrementally stepped by one.

15. A memory device as claimed in claim 12 wherein said counting means (4) is operable to generate a predetermined sequence of numbers.

16. A memory device as claimed in claim 12 wherein said processing means included means (24) for rotating the bits of said identifier value by a predetermined amount.

17. A memory device as claimed in claim 11 wherein said processing means includes means (28) for extracting the w least significant bits of said identifier values where w=log$_2$N thereby to generate said index values.

18. A memory device according to claim 11 wherein said counting means (4) comprises a step counter and said numbers in said number sequence are incrementally stepped by one.

19. A memory device as claimed in claim 11 wherein said counting means (4) is operable to generate a predetermined sequence of numbers.

20. A memory device as claimed in claim 11 wherein said processing means included means (24) for rotating the bits of said identifier value by a predetermined amount.

21. A memory device as claimed in claim 11 comprising switch means (20) having first and second inputs (x, y) and an output and operable selectively to connect one or the other of said inputs to said output;

register means (22) having an input connected to the output of said switch means (20) and an output;

a fist function generator (28) coupling said register to said array (2);

a second function generator (24) coupling the output of said register to the second input bracket (y) of said switch means; and a control means for controlling the operation of said counting means, said switch means, said register and said array.

* * * * *

UNITED STATES PATENT AND TRADEMARK OFFICE
CERTIFICATE OF CORRECTION

PATENT NO.    : 6,665,210 B1
DATED         : December 16, 2003
INVENTOR(S)   : Harvey It is certified that error appears in the above-identified patent and that said Letters Patent is hereby corrected as shown below:

<u>Column 7,</u>
Line 6, delete "firer" and insert -- further --.

Signed and Sealed this

Twenty-third Day of March, 2004

JON W. DUDAS
*Acting Director of the United States Patent and Trademark Office*